(12) United States Patent
Lin et al.

(10) Patent No.: US 8,917,133 B2
(45) Date of Patent: Dec. 23, 2014

(54) CLOCK GENERATION METHOD AND SYSTEM

(71) Applicant: M31 Technology Corporation, Zhubei, Hsinchu County (TW)

(72) Inventors: Chih-Jou Lin, Zhubei (TW);
Yuan-Hsun Chang, Zhubei (TW);
Cheng-Ji Chang, Zhubei (TW);
Ting-Chun Huang, Taipei (TW);
Yu-Sheng Yi, Zhubei (TW)

(73) Assignee: M31 Technology Corporation, Hsinchu County (TW)

( * ) Notice: Subject to any disclaimer, the term of this patent is extended or adjusted under 35 U.S.C. 154(b) by 0 days.

(21) Appl. No.: 14/058,302

(22) Filed: Oct. 21, 2013

(65) Prior Publication Data
US 2014/0043082 A1    Feb. 13, 2014

Related U.S. Application Data

(63) Continuation-in-part of application No. 13/476,017, filed on May 21, 2012, now Pat. No. 8,593,199.

(51) Int. Cl.
*H03K 3/00*    (2006.01)
*H03K 3/64*    (2006.01)
*H04L 7/10*    (2006.01)
*G06F 1/04*    (2006.01)
*G06F 1/03*    (2006.01)

(52) U.S. Cl.
CPC .. *H03K 3/64* (2013.01); *H04L 7/10* (2013.01); *G06F 1/04* (2013.01); *G06F 1/0321* (2013.01)
USPC .......................................... 327/291; 327/298

(58) Field of Classification Search
None
See application file for complete search history.

(56) References Cited

U.S. PATENT DOCUMENTS

| | | | |
|---|---|---|---|
| 5,712,628 A * | 1/1998 | Phillips et al. | 340/10.51 |
| 7,254,203 B2 * | 8/2007 | Gavardoni et al. | 375/355 |
| 8,593,199 B2 * | 11/2013 | Lin et al. | 327/291 |

\* cited by examiner

*Primary Examiner* — An Luu
(74) *Attorney, Agent, or Firm* — Leong C. Lei

(57) ABSTRACT

The clock generation method contains the following steps. In a pulse recognition step, an input pulse signal is first filtered to remove a shorter signal. Then, a width digitization calculation is conducted on the remaining pulse signal. Based on the width digitization calculation, a signal is recorded and a period of the recorded signal is determined. The value of the period is delivered to a gain module. In a step for verifying the input value to D/A converter, two values are input to a D/A converter from the gain module, and the output from the D/A converter is delivered to an oscillator. The gain module determines a desired input value from the gain module to the D/A converter. In a pulse generation step, the gain module inputs the desired input value to the D/A converter which in turn delivers to the oscillator for the generation of a corresponding clock.

13 Claims, 6 Drawing Sheets

CLOCK GENERATION METHOD AND SYSTEM

CROSS-REFERENCE TO RELATED APPLICATIONS

This application is a continuation-in-part of U.S. application Ser. No. 13/476,017, filed May 21, 2012, the entire contents of which are hereby incorporated by reference in their entirety.

BACKGROUND OF THE INVENTION (a) Technical Field of the Invention

The present invention is generally related to clock generation methods and systems, and more particularly to a method and a system recognizing the relationship between pulse periods so as to produce synchronized clock.

(b) Description of the Prior Art

Data transmission between devices requires that the devices' clocks must be synchronized so that the data can be accurately received and decoded. For example, data transmission over interfaces such as USB (Universal Serial Bus), SATA (Serial Advanced Technology Attachment), or PCIE (Peripheral Component Interconnect Express) must have the clocks synchronized in advance before the transmission is actually conducted. Especially for high-speed data transmission interface such as USB 2.0 or 3.0, achieving accurate and quick clock synchronization is a key issue.

Conventionally, clock synchronization is achieved by techniques such as phase lock loop (PLL) or delay lock loop (DLL). However, these techniques have limitations such as the requirement for an input reference clock, long data training sequence, extended synchronization time, complex frequency locking circuit, etc.

Additionally, some techniques require an external crystal or ceramic oscillator for the generation of clock pulses. Despite that, sometimes synchronization still fails to achieve between the master and slave devices. The crystal or ceramic oscillator would also add to the production cost.

SUMMARY OF THE INVENTION

Therefore, an objective of the present invention is to provide a clock generation method and system which utilizes a pulse recognition technique on the training sequence present in the serial link or a pattern inserted regularly so as to achieve quick and accurate clock synchronization and locking.

To achieve the objective, the present invention provides a clock generation method containing a pulse recognition step, a step for verifying the input value to digital-to-analog (D/A) converter, and a pulse generation step. In the pulse recognition step, an input pulse signal is first filtered to remove a shorter signal. Then, a width digitization calculation is conducted on the remaining pulse signal. Subsequently, based on the regularity of the input pulse signal and the result of the width digitization calculation, a signal conforming to the regularity and having identical width is recorded and a period of the recorded signal is determined. The value of the period is delivered to a gain module. In the step for verifying the input value to digital-to-analog (D/A) converter, two values are input to a D/A converter from the gain module, and the output from the D/A converter is delivered to an oscillator. The gain module then, based on a proportional value between the oscillator's output value and the input values, determines a desired input value from the gain module to the D/A converter based on the proportional value and a multiple of the period. In the pulse generation step, the gain module inputs the desired input value to the D/A converter which in turn delivers to the oscillator for the generation of a corresponding clock.

The method can quickly obtain synchronized clock from the training sequence present in the serial link or a pattern inserted regularly. Additionally, the method does not require additional crystal or ceramic oscillator for reduced production cost.

The method can further contain a temperature compensation step which provides a current or voltage signal to the oscillator based on a current ambient temperature. The oscillator then adjusts its output so that the output clock is immune from the impact of temperature variation and therefore has an enhanced stability.

The method can further contain a feedback compensation step where the actual output from the oscillator is compared against the desired output value. Then, the oscillator is adjusted so that the difference with the desired output value is zero or approaching zero. As such, the output clock has an enhanced robustness and is immune from outside influence.

The method can further contain a power noise compensation step, which monitors the power noise and adjusts the output of the oscillator accordingly, or adjusts the oscillator in advance between two patterns where data communication occurs in anticipation of frequency variation due to voltage changes. As such, unexpected variation and thus data transmission error due to power noise is avoided.

Another objective of the present invention is to provide a clock generation system a clock generation system containing a pulse recognition unit, a gain module, a digital-to-analog (D/A) converter, and an oscillator. The pulse recognition unit filters an input pulse signal to remove a shorter signal. Then, the pulse recognition unit conducts a width digitization calculation on the remaining pulse signal. Subsequently, based on the regularity of the input pulse signal and the result of the width digitization calculation, the pulse recognition unit records a signal conforming to the regularity and having identical width and a period of the recorded signal is determined. The gain module is electrically connected to the pulse recognition unit and receives the value of the period from the pulse recognition unit. The D/A converter is electrically connected to the gain module, and the oscillator is electrically connected to the D/A converter.

The system, together with the method, can quickly obtain synchronized clock without additional crystal or ceramic oscillator and without lengthy calculation process.

The system further contains a temperature compensation unit which detects an ambient temperature and provides a current or voltage signal to the oscillator so as to reduce the impact of temperature variation.

The system can further contain a frequency adjustment unit electrically connected to the oscillator and the D/A converter. The frequency adjustment unit compares the actual output from the oscillator against a multiple of the period obtained from the pulse recognition unit. The comparison result is then delivered to the D/A converter.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
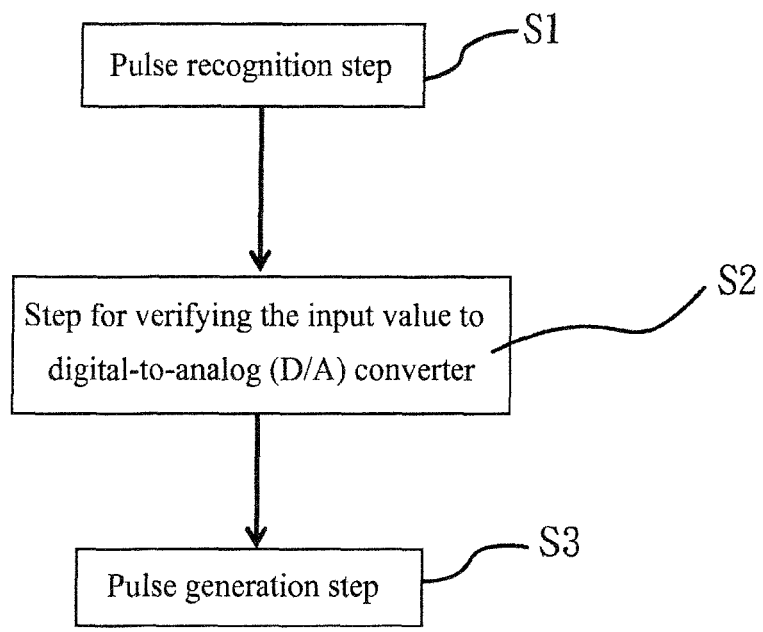
FIG. 1 is a flow diagram showing a clock generation method according to an embodiment of the present invention.

As shown in FIG. 1, a clock generation method according to the present invention contains a pulse recognition step (S1), a step for verifying the input value to digital-to-analog (D/A) converter (S2), and a pulse generation step (S3).

The pulse recognition step (S1) is as follows. In this step, an input pulse signal (e.g., the training sequence present in the serial link or a pattern inserted regularly) is first filtered to remove a shorter signal. Then, a width digitization calculation is conducted on the remaining pulse signal. Subsequently, based on the regularity of the input pulse signal and the result of the width digitization calculation, a signal conforming to the regularity and having identical width is recorded and a period of the recorded signal is determined. The value of the period is delivered to a gain module (KVCO) as a reference. The width digitization calculation is based on time. For example, if a pulse signal lasts N1 seconds, the width of the signal is N1. Similarly, if another pulse signal lasts N2 seconds, the width is then N2. There are other ways of width digitization calculation and are not limited to time only. The advantage of this step is that the period can be quickly determined. Additionally, if the step is applied to a transmission system requiring clock synchronization in advance, there is no need to read the data and determine the clock period before hand. Compared to the prior art, the step greatly enhances the efficiency of clock period synchronization.

Figure 2:
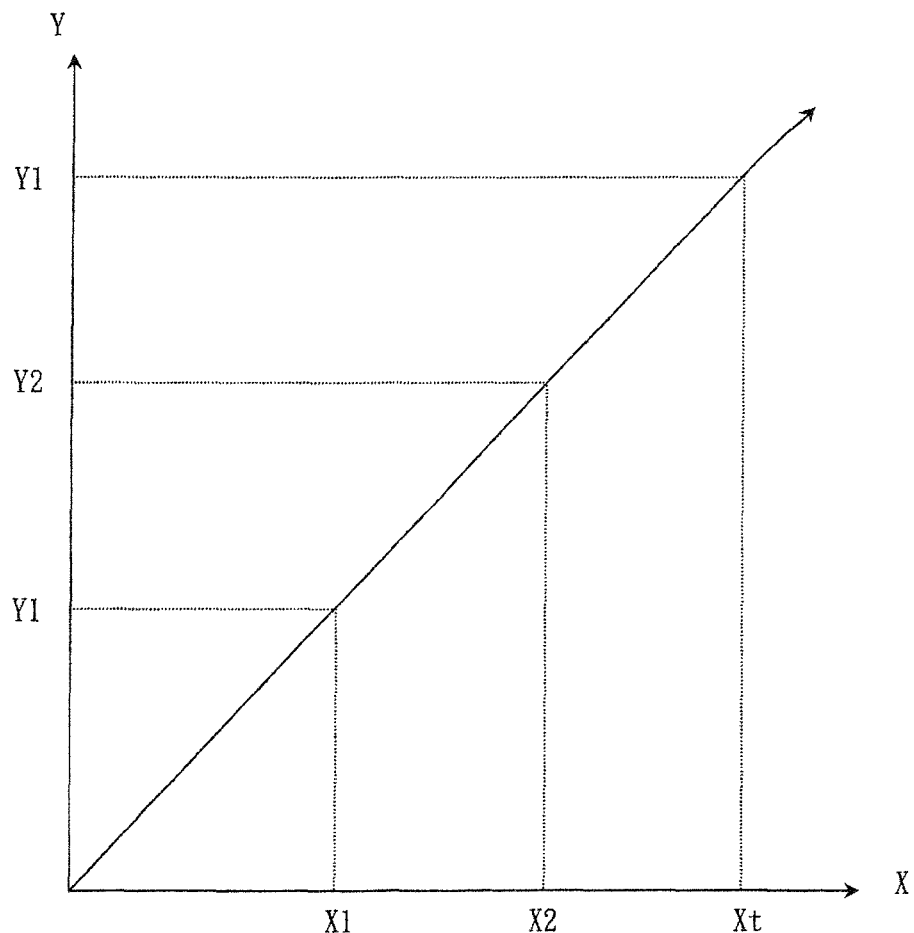
FIG. 2 is a schematic diagram showing the proportional relationship between values input to the D/A converter and output from the oscillator according to an embodiment of the present invention.

The step for verifying the input value to digital-to-analog (D/A) converter (S2) is as follows. Two values are input to a D/A converter from the gain module (KVCO), and the output from the D/A converter is delivered to an oscillator. The gain module then, based on a proportional value between the oscillator's output value and the input values, determines a desired input value from the gain module to the D/A converter. As shown in FIG. 2, the horizontal X axis represents the value input to the D/A converter from the gain module whereas the vertical Y axis represents the output value from the oscillator. When a value X1 for a period is input, a corresponding Y1 is produced. Then, another value X2 for a period is input, another corresponding Y2 is produced. Based on the two sets of values (X1, Y1, X2, Y2), a proportional value (i.e., the slope of the slant line in the drawing) can be determined. If Yt is a desired output value which is a ratio of the period determined by the pulse recognition step (S1) to a target frequency, the desired input value Xt can be determined by the proportional value. In other words, the desired input value to the D/A converter can be quickly decided after the input of two values and the determination of the proportional value.

The pulse generation step (S3) is as follows. The gain module inputs the desired input value to the D/A converter which in turn delivers to the oscillator for the generation of a corresponding clock.

From the steps above, synchronized clock can be quickly produced without additional crystal or ceramic oscillator so that data transmission can be conducted with greatly enhanced efficiency.

Figure 3:
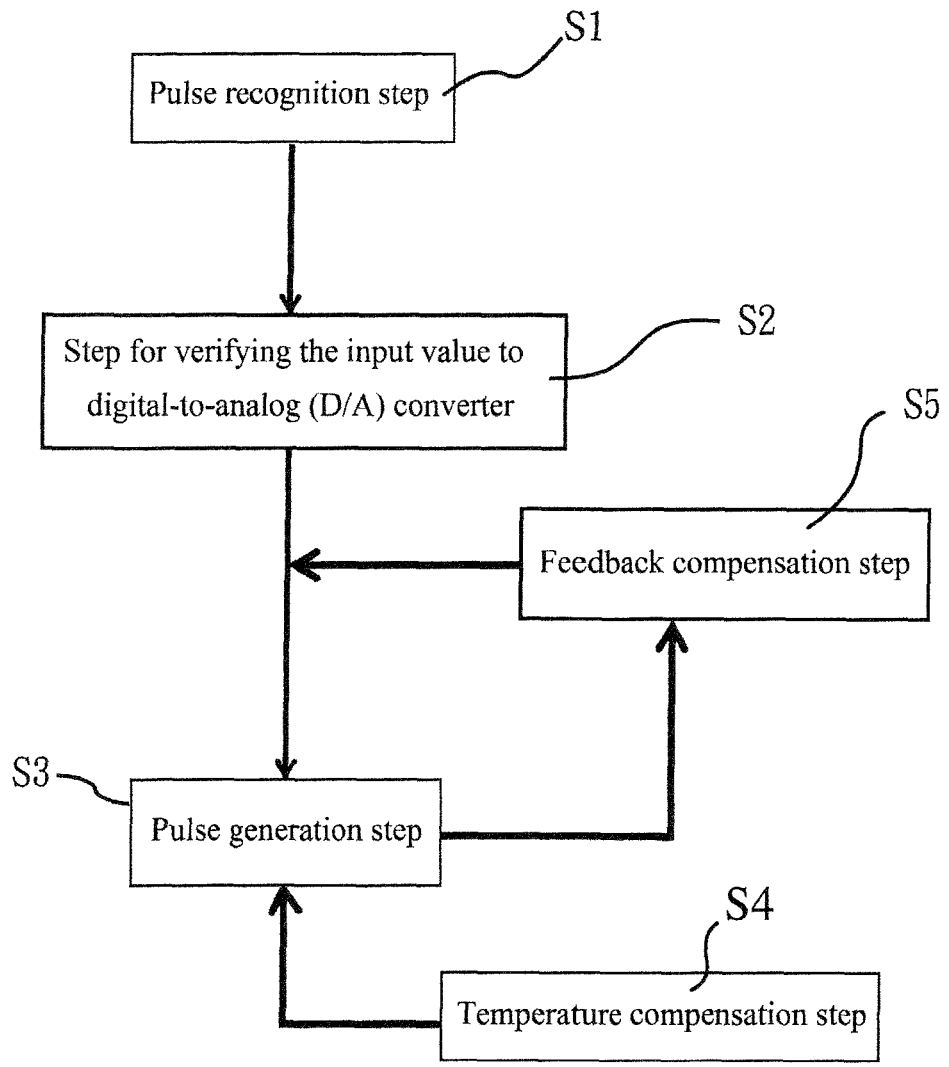
FIG. 3 is a flow diagram showing a clock generation method according to another embodiment of the present invention.

A shown in FIG. 3, the method can further contain a temperature compensation step (S4) as follows. By a temperature compensation unit which is electrically connected to the oscillator and provides a current or voltage signal to the oscillator based on a current ambient temperature, the oscillator adjusts its output in accordance with the current or voltage signal. As such, the output clock is immune from the impact of temperature variation and therefore has an enhanced stability.

Additionally, the method can further contain a feedback compensation step (S5) as follows. In this step, the actual output from the oscillator in a period is compared against the Yt obtained from the pulse recognition step (S1). The comparison is based on the actual number of output pulses in a period against Yt. Then, the oscillator is adjusted so that the difference with Yt is zero or approaching zero. As such, the output clock has an enhanced robustness and is immune from outside influence.

Figure 5:
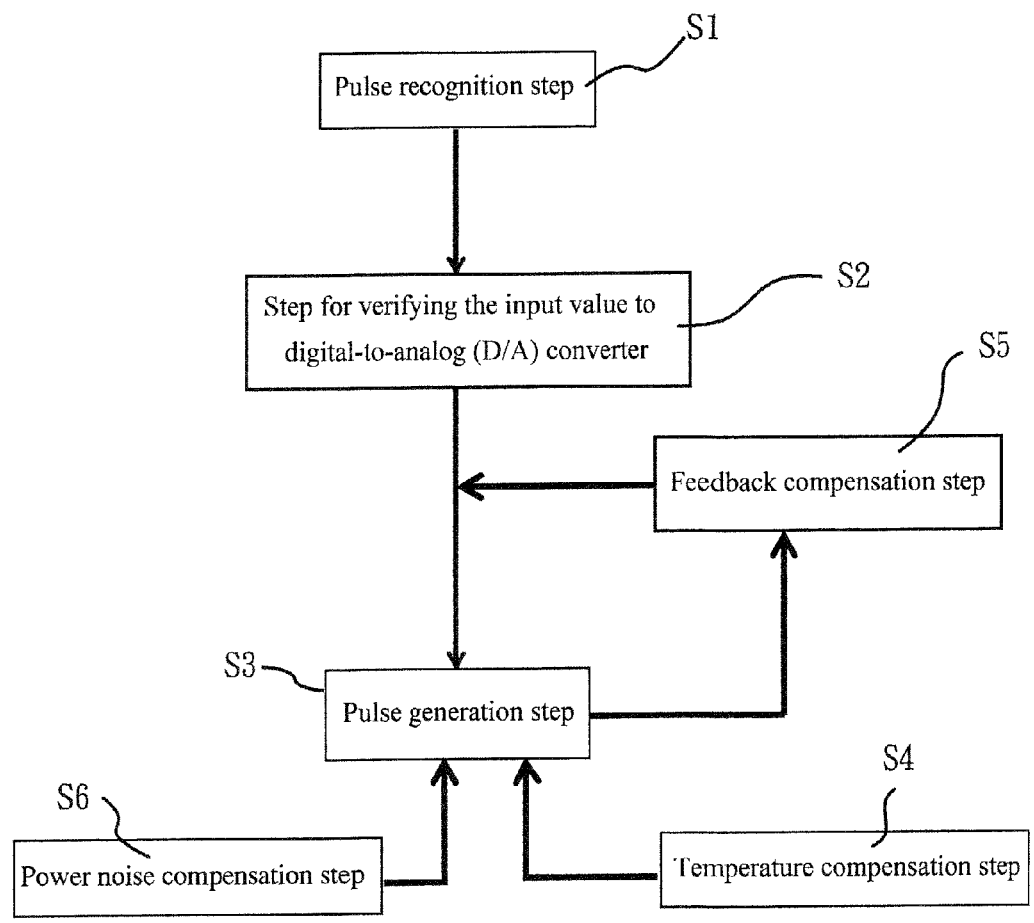
FIG. 5 is a flow diagram showing a clock generation method according to yet another embodiment of the present invention.

As shown in FIG. 5, the method can further contain a power noise compensation step (S6), in which the power noise is detected and the output of the oscillator is adjusted accordingly so that unexpected variation and thus data transmission error due to power noise is avoided. To achieve this power noise compensation, a stable power value is detected when the method is initialized and is then used as a reference. When power noise is detected, its difference with the stable power value is obtained and quantified. The quantification result is then transformed into a corresponding frequency variation ratio, which is applied to the oscillator to adjust its output. The instances when the power noise is detected can be arranged between two patterns where data communication is conducted.

The above-mentioned step can also be used to compensate the frequency reduction in anticipation of increased power noise. In other words, instead of detecting power noise from time to time, the oscillator is adjusted in advance to account for the future anticipated power noise. For example, when data is transmitted or received, power consumption would increase, voltage would drop (i.e., power noise), and the output frequency of the oscillator would decline. With this step, the output frequency of the oscillator is increased when data transmission or reception is about to start. After the communication is started, the increased output frequency drops to its normal level. After the communication stops and power consumption is normal (i.e., no power noise), the output frequency of the oscillator is adjusted to its normal level. Since data transmission and reception occurs at foreseeable instances, this step can obtain the required adjustments corresponding to various conditions and applies the required adjustment in advance to the oscillator. Additionally, after the preventative adjustment is applied and during the corresponding condition, the monitoring to the power noise can still be carried out so as to fine-tune the oscillator and to achieve even greater output stability.

Figure 4:
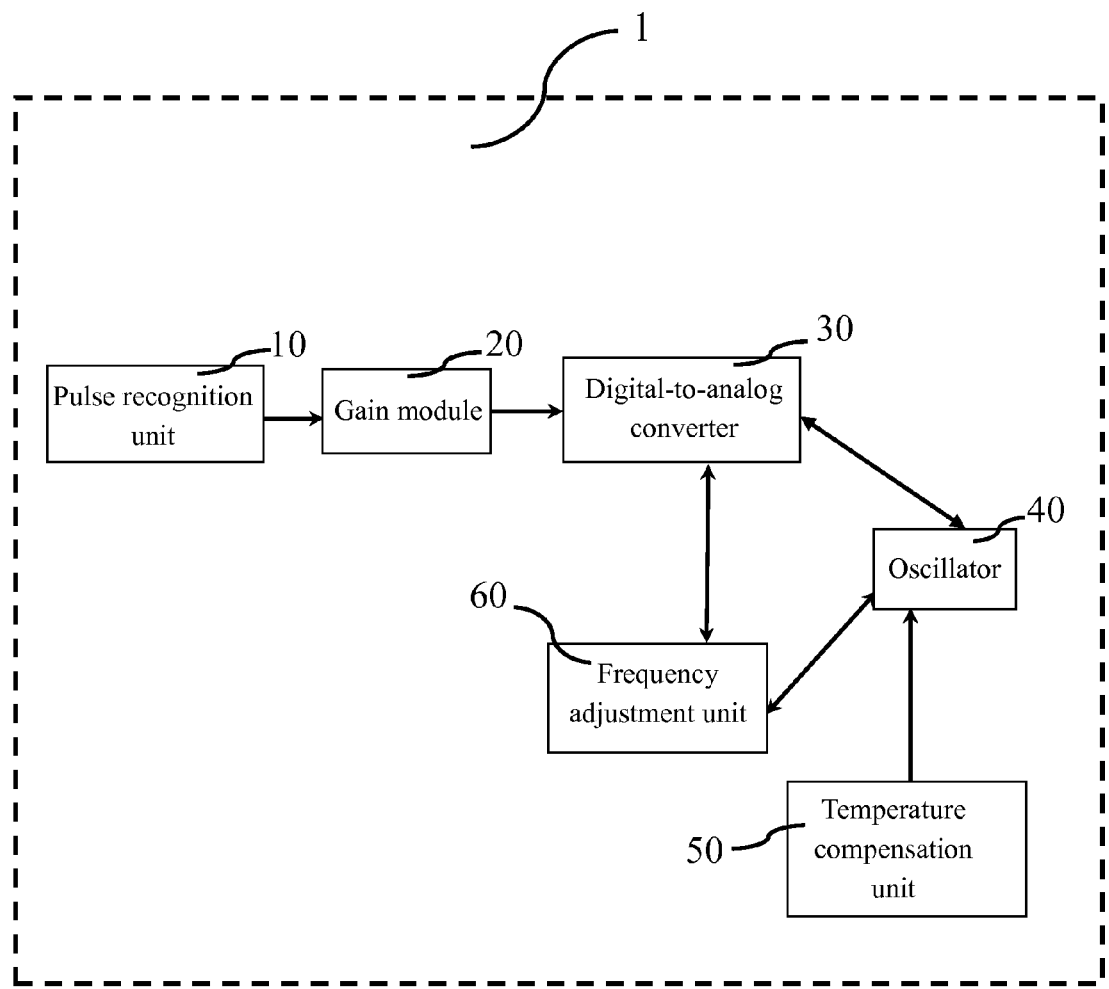
FIG. 4 is a functional block diagram showing a clock generation system according to an embodiment of the present invention.

As shown in FIG. 4, a clock generation system according to the present invention contains a pulse recognition unit 10, a gain module 20, a digital-to-analog (D/A) converter 30, and an oscillator 40. The pulse recognition unit 10 is electrically connected to the gain module 20 which in turn is electrically connected to the D/A converter 30. The oscillator 40 is electrically connected to the D/A converter 30 and produced an output clock signal.

The pulse recognition unit 10 filters an input pulse signal (e.g., the training sequence present in the serial link or a pattern inserted regularly) to remove a shorter signal. Then, the pulse recognition unit 10 conducts a width digitization calculation on the remaining pulse signal. Subsequently, based on the regularity of the input pulse signal and the result of the width digitization calculation, the pulse recognition unit 10 records a signal conforming to the regularity and having identical width and a period of the recorded signal is determined. The width digitization calculation is based on time. For example, if a pulse signal lasts N1 seconds, the width of the signal is N1. Similarly, if another pulse signal lasts N2 seconds, the width is then N2. There are other ways of width digitization calculation and are not limited to time only.

The gain module 20 is electrically connected to the pulse recognition unit 10 and receives the value of the period from the pulse recognition unit 10. Then, according to the step for verifying the input value to digital-to-analog (D/A) converter (S2) described earlier, the gain module 20 outputs two values to the D/A converter 30, and the output from the D/A converter 30 is delivered to the oscillator 40. The gain module 20 then, based on a proportional value between the oscillator 40's output value and the input values, determines a desired input value from the gain module 20 to the D/A converter 30. The details about the proportional value have already been described earlier and are omitted here.

Briefly, the pulse recognition unit 10 delivers the obtained period value to the gain module 20. Together with the quickly obtained proportional value, the gain module 20 then drives the D/A converter 30 to output to the oscillator 40 so that the oscillator produces the desired clock. As such, the system can quickly produce synchronized clock so that data transmission can be conducted with greatly enhanced efficiency.

The system further contains a temperature compensation unit 50 which detects an ambient temperature and provides a current or voltage signal to the oscillator 40. The oscillator 40 uses the current or voltage signal as a reference or is directly driven by the current or voltage signal to adjust the output clock.

Additionally, the system can further contain a frequency adjustment unit 60 electrically connected to the oscillator 40 and the D/A converter 30. The frequency adjustment unit 60 compares the actual output from the oscillator 40 against a multiple of the period obtained from the pulse recognition unit 10. The comparison result is then delivered to the D/A converter 30 so that the D/A converter 30 adjusts its output and as such the actual output value of the oscillator approaching or identical to the desired output value.

Figure 6:
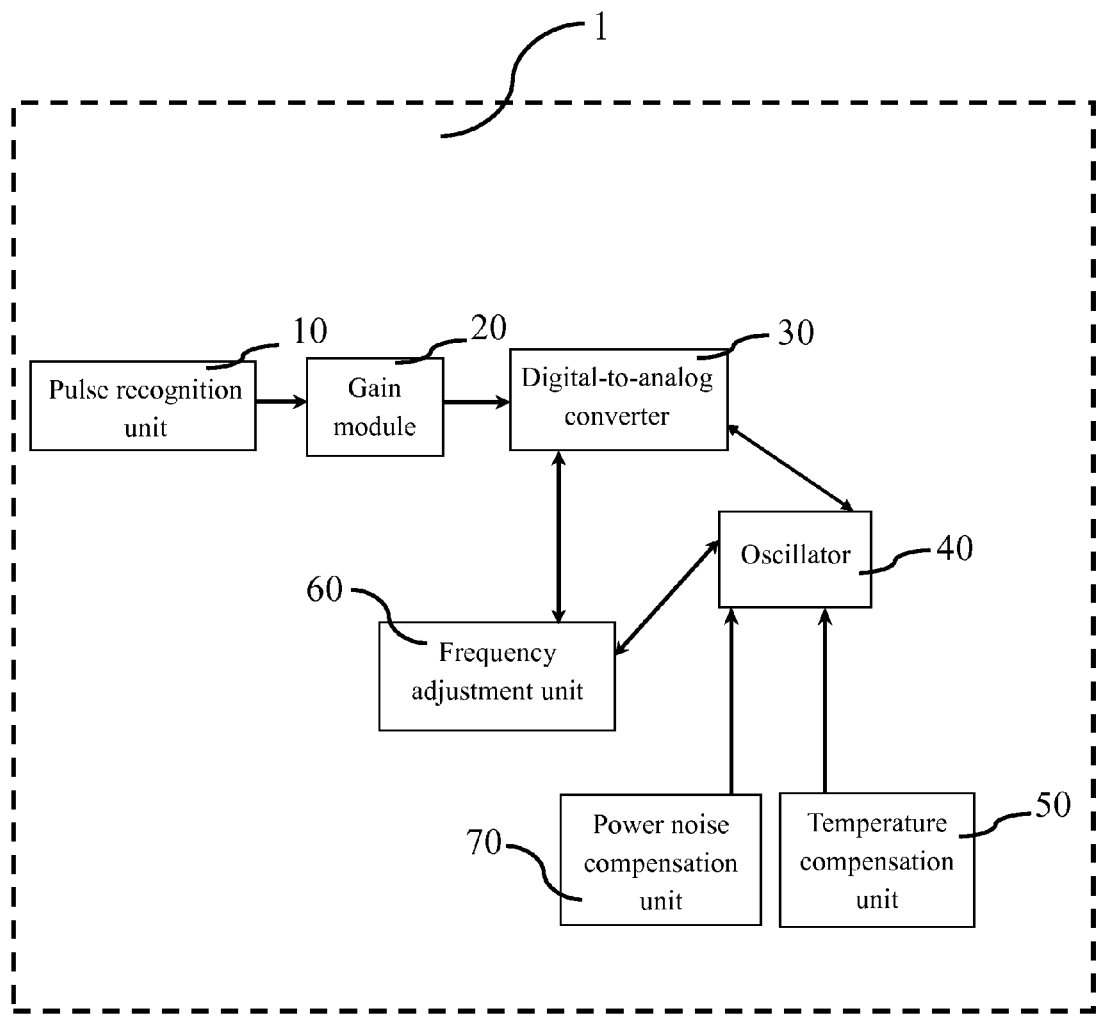
FIG. 6 is a functional block diagram showing a clock generation system according to another embodiment of the present invention.

Additionally, the system can further contain a power noise compensation unit 70 electrically connected to the oscillator 40 and a power source to the clock generation system for monitoring power noise and adjusting the oscillator accordingly so that unexpected variation and thus data transmission error due to power noise is avoided (see FIG. 6). The power noise compensation unit 70 first obtains a stable power value when the clock generation system is initialized and the stable power value is then used as a reference. When power noise is detected, its difference with the stable power value is obtained and quantified. The quantification result is then delivered to the oscillator 40 as a current signal or a voltage signal, transformed into a corresponding frequency variation ratio, and applied by the oscillator 40 to adjust its output.

Alternatively, the power noise compensation unit 70 can record the power noises under various communication conditions, and the corresponding compensations required from the oscillator 40 (or the corresponding adjustments issued to the oscillator 40). As such, the power noise compensation unit 70 can instruct the oscillator 40 to perform the required compensation in the same time when data communication is performed.

From the foregoing description, the present invention can quickly obtain synchronized clock from the input pulse signal (e.g., the training sequence present in the serial link or a pattern inserted regularly). Additionally, the present invention is able to minimize the impact of temperature, and does not require additional crystal or ceramic oscillator for reduced production cost.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A clock generation method, comprising the steps of:
   a pulse recognition step, where an input pulse signal is first filtered to remove a shorter signal; then, a width digitization calculation is conducted on the remaining pulse signal; subsequently, based on the regularity of the input pulse signal and the result of the width digitization calculation, a signal conforming to the regularity and having identical width is recorded and a period of the recorded signal is determined; and the value of the period is delivered to a gain module;
   a step for verifying the input value to digital-to-analog (D/A) converter, where two values are input to a D/A converter from the gain module, and the output from the D/A converter is delivered to an oscillator; the gain module then, based on a proportional value between the oscillator's output value and the input values, determines a desired input value from the gain module to the D/A converter based on the proportional value and a multiple of the period;
   a pulse generation step, where the gain module inputs the desired input value to the D/A converter which in turn delivers to the oscillator for the generation of a corresponding clock; and
   a power noise compensation step, where power noise is detected, the detected power noise is converted into a current signal or a voltage signal, and is delivered to the oscillator for the oscillator to adjust output accordingly.

2. The clock generation method according to claim 1, further comprising the following step:
a temperature compensation step, where a current or voltage signal is provided to the oscillator based on a current ambient temperature; and the oscillator then adjusts its output accordingly.

3. The clock generation method according to claim 2, wherein the oscillator is electrically connected to a temperature compensation unit; and the temperature compensation unit conducts temperature detection and outputs the current or voltage signal to the oscillator.

4. The clock generation method according to claim 1, further comprising the following step:
a feedback compensation step where the actual output from the oscillator is compared against a desired output value; and the oscillator is adjusted so that the difference with the desired output value is zero or approaching zero.

5. The clock generation method according to claim 4, wherein a frequency adjustment unit is electrically connected between the oscillator and the D/A converter; the frequency adjustment unit compares the actual output from the oscillator against the desired output value; and the frequency adjustment unit provides the comparison result to the D/A converter.

6. The clock generation method according to claim 1, wherein the oscillator is electrically connected to a power noise compensation unit; and the power noise compensation unit detects power noise and converts detected power noise into a current signal or a voltage signal to the oscillator for the oscillator to adjust output accordingly.

7. The clock generation method according to claim 6, wherein the power noise compensation unit is connected to a power source for detecting power noise.

8. The clock generation method according to claim 6, wherein the power noise compensation unit stores at least a required compensation to the oscillator under a corresponding communication condition.

9. A clock generation system, comprising:
a pulse recognition unit, where the pulse recognition unit filters an input pulse signal to remove a shorter signal; then, the pulse recognition unit conducts a width digitization calculation on the remaining pulse signal; subsequently, based on the regularity of the input pulse signal and the result of the width digitization calculation, the pulse recognition unit records a signal conforming to the regularity and having identical width; and a period of the recorded signal is determined;
a gain module electrically connected to the pulse recognition unit and receiving the value of the period from the pulse recognition unit;
a digital-to-analog (D/A) converter electrically connected to the gain module;
an oscillator electrically connected to the D/A converter; and
a power noise compensation unit electrically connected to the oscillator which converts detected power noise to a current signal or a voltage signal to the oscillator.

10. The clock generation system according to claim 9, further comprising:
a temperature compensation unit electrically connected to the oscillator, where the temperature compensation unit detects an ambient temperature and provides a current or voltage signal to the oscillator.

11. The clock generation system according to claim 9, further comprising:
a frequency adjustment unit electrically connected to the oscillator and the D/A converter, where the frequency adjustment unit compares the actual output from the oscillator against a multiple of the period; and the comparison result is then delivered to the D/A converter.

12. The clock generation system according to claim 9, wherein the power noise compensation unit is connected to a power source to the clock generation system for detecting power noise.

13. The clock generation system according to claim 9, wherein the power noise compensation unit stores at least a required compensation to the oscillator under a corresponding communication condition.

* * * * *